(12) United States Patent
Cho

(10) Patent No.: US 9,373,787 B2
(45) Date of Patent: Jun. 21, 2016

(54) NONVOLATILE MEMORY DEVICES

(71) Applicant: SK HYNIX INC., Icheon (KR)

(72) Inventor: Kwang Hee Cho, Seoul (KR)

(73) Assignee: SK HYNIX INC., Icheon (KR)

(*) Notice: Subject to any disclaimer, the term of this patent is extended or adjusted under 35 U.S.C. 154(b) by 0 days.

(21) Appl. No.: 14/301,284

(22) Filed: Jun. 10, 2014

(65) Prior Publication Data

US 2015/0207069 A1    Jul. 23, 2015

(30) Foreign Application Priority Data

Jan. 21, 2014    (KR) .................. 10-2014-0007479

(51) Int. Cl.
*H01L 45/00*    (2006.01)
*H01L 27/24*    (2006.01)

(52) U.S. Cl.
CPC .......... *H01L 45/145* (2013.01); *H01L 27/2409* (2013.01); *H01L 27/2418* (2013.01); *H01L 27/2463* (2013.01); *H01L 45/04* (2013.01); *H01L 45/085* (2013.01); *H01L 45/122* (2013.01); *H01L 45/1233* (2013.01); *H01L 45/143* (2013.01); *H01L 45/146* (2013.01); *H01L 45/147* (2013.01)

(58) Field of Classification Search
CPC .... H01L 45/04; H01L 45/145; H01L 45/1233
See application file for complete search history.

(56) References Cited

U.S. PATENT DOCUMENTS

| | | | | |
|---|---|---|---|---|
| 5,831,276 | A | * | 11/1998 | Gonzalez ................ H01L 27/24 257/3 |
| 5,841,150 | A | * | 11/1998 | Gonzalez ................ H01L 27/24 257/3 |
| 6,118,135 | A | * | 9/2000 | Gonzalez ............ H01L 27/1021 257/3 |
| 6,436,765 | B1 | * | 8/2002 | Liou ..................... H01L 27/115 257/E21.682 |
| 7,969,011 | B2 | | 6/2011 | Sekar et al. |
| 2008/0111120 | A1 | * | 5/2008 | Lee ..................... H01L 27/2409 257/2 |
| 2008/0278989 | A1 | | 11/2008 | Lee et al. |
| 2012/0091420 | A1 | * | 4/2012 | Kusai et al. ....................... 257/4 |
| 2013/0250656 | A1 | * | 9/2013 | Ishikawa et al. ................ 365/148 |
| 2015/0200232 | A1 | * | 7/2015 | Lin .................. H01L 23/53228 257/5 |

* cited by examiner

*Primary Examiner* — Matthew Reames
*Assistant Examiner* — Vincent Wall

(57) ABSTRACT

A nonvolatile memory device includes an inserted electrode line disposed between a first and a second electrode lines and extending in parallel with the second electrode line. The inserted electrode line is coupled to the second electrode line. A first intermediate pattern disposed between the inserted electrode line and a second intermediate pattern is disposed between the inserted electrode line and the second electrode line. One of the first and second intermediate patterns is a variable resistor and the other of the first and second intermediate patterns is a selector. The first intermediate pattern covers a bottom surface and a portion of sidewalls of the inserted electrode line.

6 Claims, 9 Drawing Sheets

NONVOLATILE MEMORY DEVICES

CROSS-REFERENCE TO RELATED APPLICATION

The present application claims priority under 35 U.S.C 119(a) to Korean Application No. 10-2014-0007479, filed on Jan. 21, 2014, in the Korean intellectual property Office, which is incorporated herein by reference in its entirety as set forth in full.

BACKGROUND

1. Technical Field

Embodiments of the present disclosure relate to nonvolatile memory devices.

2. Related Art

Various nonvolatile memory devices have been continuously developed to realize very large scale integrated (VLSI) memory devices which are capable of storing a large amount of data and retaining their stored data even when their power supplies are interrupted. Resistive random access memory (ReRAM) devices, magnetic random access memory (MRAM) devices and phase changeable random access memory (PcRAM) devices have been continuously developed to realize high performance nonvolatile memory devices. ReRAM devices employ a variable resistive material in each memory cell to store data, and the variable resistive material may be disposed between a pair of electrodes. ReRAM devices may store data in their memory cells using a hysteretic resistance switching effect of the variable resistive material.

SUMMARY

Various embodiments are directed to nonvolatile memory devices and methods of fabricating the same.

According to some embodiments, a nonvolatile memory device includes a second electrode line intersecting a first electrode line, an inserted electrode line disposed between the first and second electrode lines and extending to be parallel and self-aligned with the second electrode line, a first intermediate pattern disposed between the inserted electrode line and the first electrode line and extending to be parallel and self-aligned with the inserted electrode line, and a second intermediate pattern disposed between the inserted electrode line and the second electrode line and extending to be parallel and self-aligned with the inserted electrode line. One of the first and second intermediate patterns provides a variable resistor and the other of the first and second intermediate patterns provides a selector. The first intermediate pattern covers a bottom surface and sidewalls of the inserted electrode line.

According to further embodiments, a nonvolatile memory device includes a second electrode line intersecting a first electrode line, an inserted electrode line disposed between the first and second electrode lines and extending in parallel with the second electrode line, the inserted electrode line being coupled to the second electrode line, a first intermediate pattern disposed between the inserted electrode line and the first electrode line and extending in parallel with the inserted electrode line, the first intermediate pattern being coupled to the inserted electrode line, and a second intermediate pattern disposed between the inserted electrode line and the second electrode line and extending in parallel with the inserted electrode line, the second intermediate pattern being coupled to the inserted electrode line. A bottom portion of the inserted electrode line protrudes downwardly and is lodged in a upper portion of the first electrode line.

According to further embodiments, a method of fabricating a nonvolatile memory device includes forming a dielectric layer covering a first electrode line, patterning the dielectric layer to form a trench exposing a portion of the first electrode line, forming a first intermediate pattern on a bottom surface and sidewalls of the trench, forming an inserted electrode pattern on the first intermediate pattern to fill the trench, recessing the inserted electrode pattern to form an inserted electrode line remaining in a lower portion of the trench, forming a second intermediate pattern on the inserted electrode line, and forming a second electrode line on second intermediate pattern to fill an upper portion of the trench.

According to further embodiments, a method of fabricating a nonvolatile memory device includes forming a first electrode line and forming a stack structure on the first electrode line. The stack structure is formed to include a second electrode line intersection the first electrode line, an inserted electrode line disposed between the first and second electrode lines and extending to be parallel and aligned with the second electrode line, a first intermediate pattern disposed between the inserted electrode line and the first electrode line and extending to be parallel and self-aligned with the inserted electrode line, and a second intermediate pattern disposed between the inserted electrode line and the second electrode line and extending to be parallel and self-aligned with the inserted electrode line. One of the first and second intermediate patterns provides a variable resistor and the other of the first and second intermediate patterns provides a selector. The first intermediate pattern covers a bottom surface and sidewalls of the inserted electrode line.

BRIEF DESCRIPTION OF THE DRAWINGS

Embodiments will become more apparent in view of the attached drawings and accompanying detailed description, in which.

DETAILED DESCRIPTION OF THE EMBODIMENTS

Figure 1:
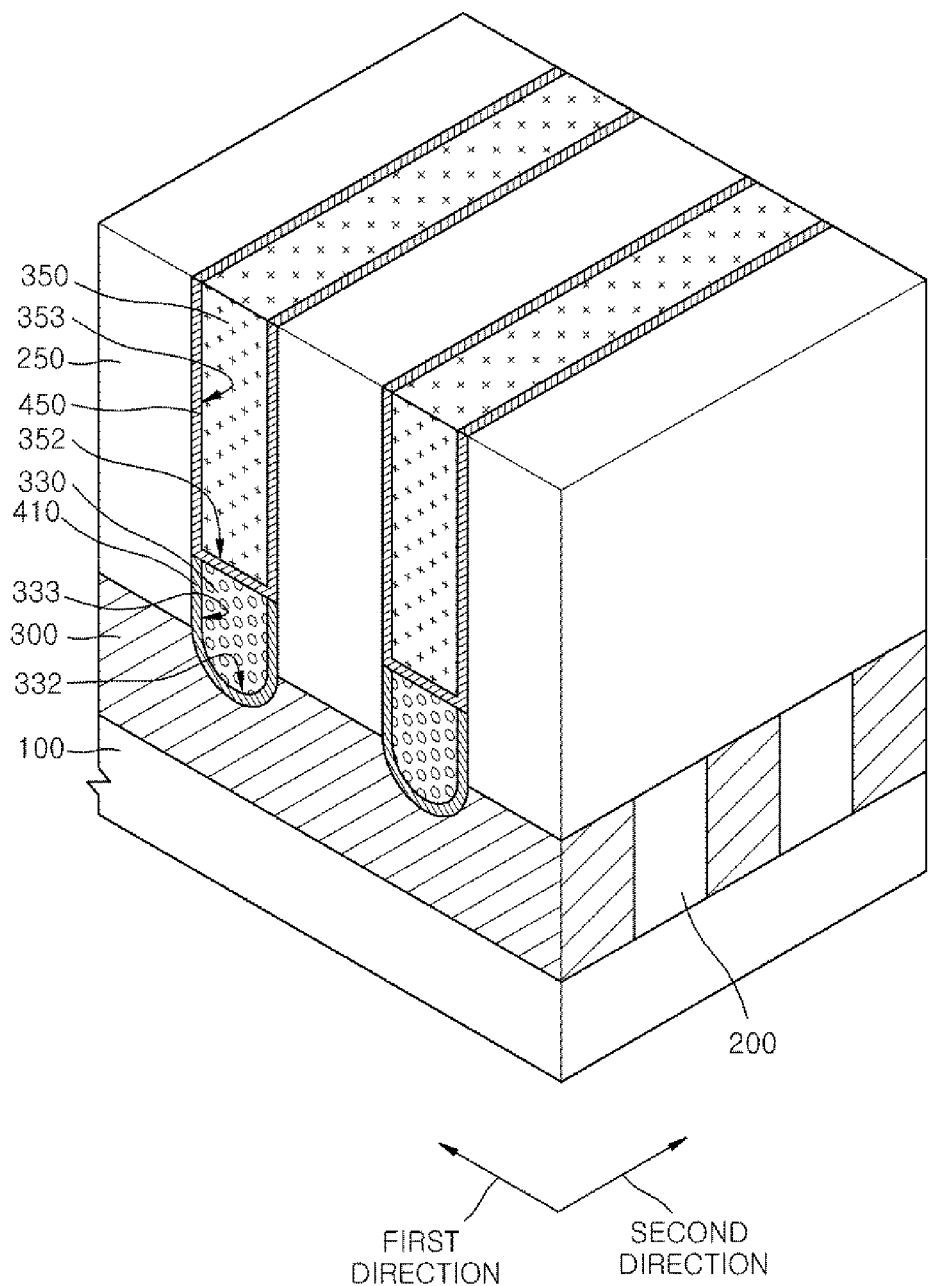
FIG. 1 is a perspective view illustrating a nonvolatile memory device according to an embodiment.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for the purpose of describing particular embodiments only and are not intended to limit the scope of this disclosure.

A nonvolatile memory device according to embodiments of this disclosure may be a resistive memory device including a plurality of resistive memory cells, each of which has a metal-insulator-metal-insulator-metal (MIMIM) structure including a single switch and a single resistor. The resistive memory device may be configured to have a cross bar array structure including a plurality of upper electrode lines and a plurality of lower electrode lines intersecting the plurality of upper electrode lines. In a cross bar array structure of a resistive memory device, the resistive memory cells may be located at intersections of upper electrode lines and lower electrode lines, and each resistive memory cells may have a metal-insulator-metal-insulator-metal (MIMIM) structure including a single switch and a single resistor. An inserted electrode line may be disposed between the upper electrode line and the lower electrode line, and the inserted electrode line may extend in parallel and aligned with the upper electrode line. In addition, a pair of intermediate patterns may be disposed on and under the inserted electrode line, respectively.

Spatially relative terms of this disclosure are given with respect to the orientation shown in the figures, where a surface that is etched is an upper or top surface, and a surface which is placed face-down during formation processes is a bottom surface. However, the terms should not be interpreted as applying to specific orientations of a functional device in use. For example, while the term "top" may be used in this disclosure to refer to the orientation of the figures, when a device is inverted or turned to some arbitrary angle, the term "top" does not refer to the orientation at the arbitrary angle.

One of the pair of intermediate patterns disposed on and under the inserted electrode line may act as a variable resistor whose resistance value varies according to a voltage applied between the corresponding upper and lower electrode lines to store one or more bit of data therein. The variable resistor may have a high resistance state (HRS) and a low resistance state (LRS), and the high resistance state (HRS) and the low resistance state (LRS) may correspond to a "1" and a "0", respectively, or vice versa. The other of the pair of intermediate patterns disposed on and under the inserted electrode line may act as a selector. For example, the other intermediate pattern may be a diode for selecting a desired memory cell in a read mode or in a write mode. When data stored in one of the memory cells located at intersections of the lower electrode lines and the upper electrode lines is selectively read out in a read mode, the selectors of non-selected memory cells may prevent a leakage current from flowing through a current path of structures for non-selected memory cells regardless of the data (HRS or LRS) stored in the variable resistors of the non-selected memory cells. When one of the memory cells is selectively written in a write mode, the selectors of non-selected memory cells may prevent a leakage current from flowing through a current path of structures for non-selected memory cells regardless of non-selected memory cells. In other words, the selector may prevent sneak currents in a device.

Referring to FIG. 1, a nonvolatile memory device according to an embodiment may include an array of first electrode lines 300 extending in a first direction, an array of second electrode lines 350 intersecting the first electrode lines 300 and extending in a second direction orthogonal to the first direction, inserted electrode lines 330 disposed between the first electrode lines 300 and the second electrode lines 350 and extending in parallel and aligned with the second electrode lines 350, first intermediate patterns 410 disposed between the inserted electrode lines 330 and the first electrode lines 300 and extending in parallel and aligned with the inserted electrode lines 330, and second intermediate patterns 450 disposed between the inserted electrode lines 330 and the second electrode lines 350 and extending to be parallel and aligned with the inserted electrode lines 330.

Either of the first intermediate pattern 410 or the second intermediate pattern 450 may be used as a variable resistor with a state corresponding to data, and the other of the first intermediate pattern 410 and second intermediate pattern 450 may be used as a selector that is activated to select a desired memory cell. For example, if each of the first intermediate patterns 410 is used as a variable resistor, each of the second intermediate patterns 450 may be used as a selector. On the contrary, if the first intermediate patterns 410 are used as the variable resistors, the second intermediate patterns 410 may be used as selectors.

A nonvolatile memory device according to an embodiment may be a resistive memory device (also referred to as a resistive random access memory (ReRAM) device) in which second electrode lines 350 intersect the first electrode lines 300. Thus, memory cells are located at intersections of the first and second electrode lines 300 and 350, and the nonvolatile memory device may have a cross bar array structure. In an embodiment in which the first intermediate patterns 410 (or the second intermediate patterns 450) are used as variable resistors, each of the first intermediate patterns 410 (or the second intermediate patterns 450) may have at least two electrical or resistive states to provide a memory layer in which a data is stored.

Each of the first intermediate patterns 410 (or the second intermediate patterns 450) may include a variable resistor such as a resistive switching material. In such an embodiment, the nonvolatile memory device may be a ReRAM device. The resistance switching material may include a colossal magneto resistance (CMR) material or a praseodymium calcium manganese oxide ($Pr_{1-x}Ca_xMnO_3$) (hereinafter, referred to as a "PCMO") material whose resistance value varies according to an electric field applied thereto. Alternatively, the resistance switching material may include a binary transition metal oxide material (e.g., a hafnium oxide material, a tantalum oxide material, a zirconium oxide material, a niobium oxide material, a titanium oxide material, a nickel oxide material or an aluminum oxide material) having a nonstoichiometric composition. The binary transition metal oxide material having a nonstoichiometric composition may contain a relatively high transition metal content compared to a stable binary transition metal oxide material having a stoichiometric composition.

In some embodiments, the resistance switching material may include a chalcogenide material having an amorphous state. In other embodiments, the resistance switching material may include a ferroelectric material (e.g., a strontium titanium oxide ($SrTiO_3$) material or a strontium zirconium oxide ($SrZrO_3$) material) having a perovskite structure doped with chrome (Cr) or niobium (Nb). In still other embodiments, the resistance switching material may include a solid electrolyte material (e.g., a germanium selenide (GeSe) material doped with silver (Ag) of relatively high ion mobility. The solid electrolyte material doped with silver (Ag) may have a programmable metallization cell (PMC) structure. That is, the germanium selenide (GeSe) material doped with silver (Ag) may have two resistive states according to the presence or absence of conductive filaments generated by an electrochemical reaction. In still other embodiments, the resistance switching material may include a transition metal oxide material having a nonstoichiometric composition, for example, a titanium oxide ($Ti_4O_7$) material.

In an embodiment in which the second intermediate patterns 450 (or the first intermediate patterns 410) are used as selectors, the second intermediate patterns 450 (or the first intermediate patterns 410) may have various configurations. For example, the second intermediate patterns 450 (or the first intermediate patterns 410) may include a diode having a transition metal oxide layer acting as a tunnel barrier layer. The tunnel barrier layer may include a transition metal oxide such as tantalum oxide ($Ta_2O_5$), titanium oxide ($TiO_2$), hafnium oxide ($HfO_2$), zirconium oxide ($ZrO_2$), aluminum oxide ($Al_2O_3$) or the like. Alternatively, each of the second intermediate patterns 450 (or the first intermediate patterns 410) may include a PN diode. The PN diode may include a semiconductor portion that is P-doped and a semiconductor portion is N-doped, and a depletion zone at the intersection between the P and N doped portions. The second intermediate patterns 450 acting as selectors such as switching elements and the first intermediate patterns 410 acting as variable resistors may provide 1S1R (a single selector and a single resistor) memory cells which suppress interference between memory cells in a cross bar array structure.

Referring again to FIG. 1, the first electrode lines 300, the first intermediate patterns 410, the inserted electrode lines 330, the second intermediate patterns 450 and the second electrode lines 350 may constitute MIMIM-type cell structures of a ReRAM device. The inserted electrode lines 330 may extend in parallel and aligned with respective ones of the second electrode lines 350. The first intermediate patterns 410 may extend to be parallel with the inserted electrode lines 330 and may be substantially aligned with respective inserted electrode lines 330. In addition, the first intermediate patterns 410 may cover bottom surfaces 332 of the inserted electrode lines 330 and may extend to cover sidewalls 333 of the inserted electrode lines 330. The second intermediate patterns 450 may extend in parallel with the inserted electrode lines 330 and may be substantially aligned with respective second electrode lines 350. Moreover, the second intermediate patterns 450 may cover bottom surfaces 352 of the second electrode lines 350 and may extend to cover sidewalls 353 of the second electrode lines 350.

The first electrode lines 300, the inserted electrode lines 330, and the second electrode lines 350 may include a conductive material such as a metal. For example, the second electrode lines 350 may include copper (Cu) or tungsten (W). In other embodiments, the first electrode lines 300, the inserted electrode lines 330, and the second electrode lines 350 may include silver (Ag), gold (Au), platinum (Pt), aluminum (Al), indium tin oxide (ITO), nickel (Ni), titanium (Ti) or titanium nitride (TiN). In some embodiments, the first electrode lines 300, the inserted electrode lines 330, and the second electrode lines 350 include a silicon material doped with N-type impurities or P-type impurities. Individual first electrode lines 300 may be separated from each other by a first dielectric layer 200, and aligned pairs of inserted electrode lines 330 and second electrode lines 350 may be separated from one another by a second dielectric layer 250 that covers the first electrode lines 300 and the first dielectric layer 200.

Figure 2:
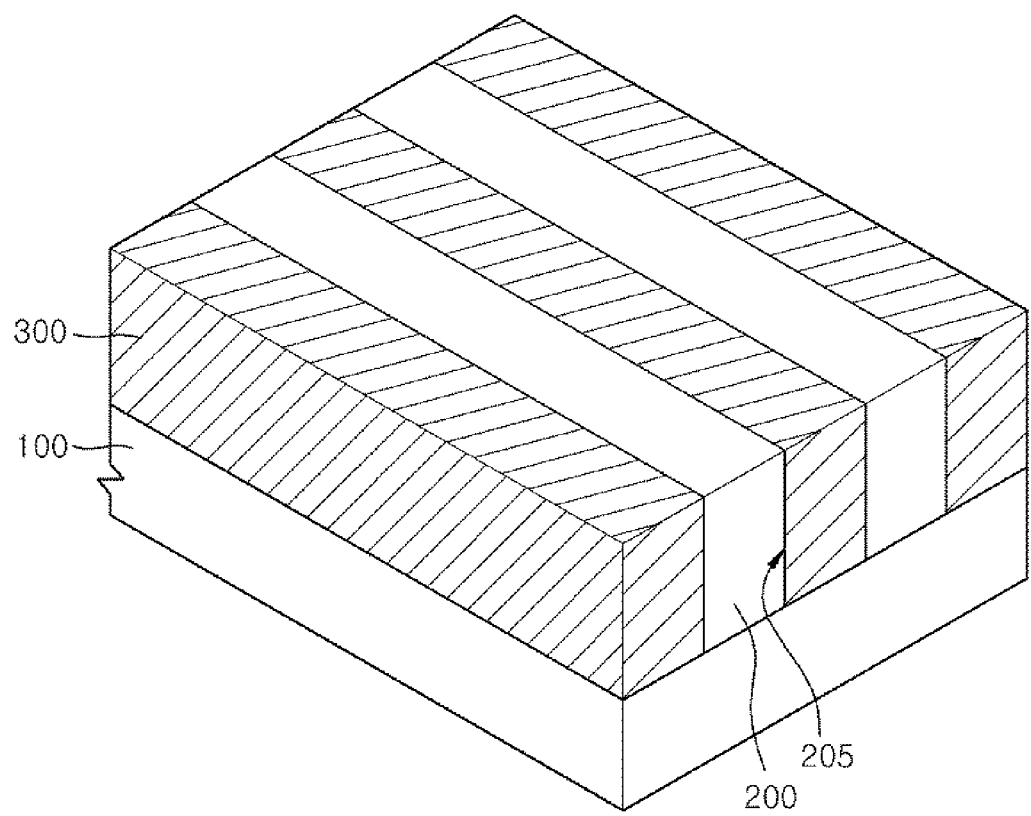
FIGS. 2 to 9 are schematic views illustrating a method of fabricating a nonvolatile memory device according to an embodiment.

FIG. 2 is a perspective view illustrating a method of fabricating a nonvolatile memory device according to an embodiment, and FIGS. 3 to 9 are cross-sectional views illustrating a method of fabricating a nonvolatile memory device according to an embodiment.

Referring to FIG. 2, a first dielectric layer 200 may be formed on a substrate 100. The substrate 100 may be a semiconductor substrate. The first dielectric layer 200 may be formed of various dielectric materials. In an embodiment, the first dielectric layer 200 includes a silicon oxide ($SiO_2$) material. The first dielectric layer 200 may be patterned to form first trenches 205 extending in a first direction. The first trenches 205 may be formed by selectively removing portions of the first dielectric layer 200 using a photolithography process and an etch process. The first dielectric layer 200 having the first trenches 205 may be used as a template for a damascene process.

A first conductive layer may be formed on the first dielectric layer 200 to fill the first trenches 205, and the first conductive layer may be planarized to form first electrode lines 300 in the first trenches 205. In some embodiments, the first conductive layer is planarized using a chemical mechanical polishing (CMP) process until a top surface of the first dielectric layer 200 is exposed. The first conductive layer may include a metal material such as copper (Cu) and tungsten (W). Alternatively, the first conductive layer may include silver (Ag), gold (Au), platinum (Pt), aluminum (Al), indium tin oxide (ITO), nickel (Ni), titanium (Ti) or titanium nitride (TiN).

Figure 3:
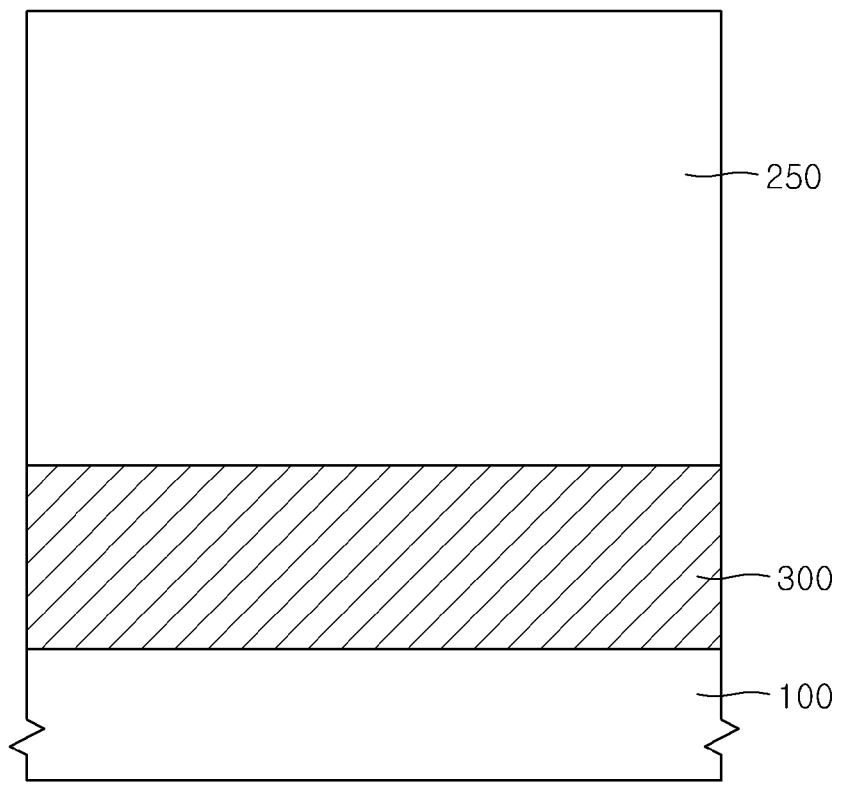

FIGS. 3 to 9 are vertical cross-sectional views taken along a line extending in a direction which is parallel with the first electrode lines 300. Referring to FIG. 3, a second dielectric layer 250 may be formed to cover the first electrode lines 300 and the first dielectric layer 200. The second dielectric layer 250 may be formed of any one of various dielectric layers. For example, the second dielectric layer 250 may include a silicon oxide ($SiO_2$) layer.

Figure 4:
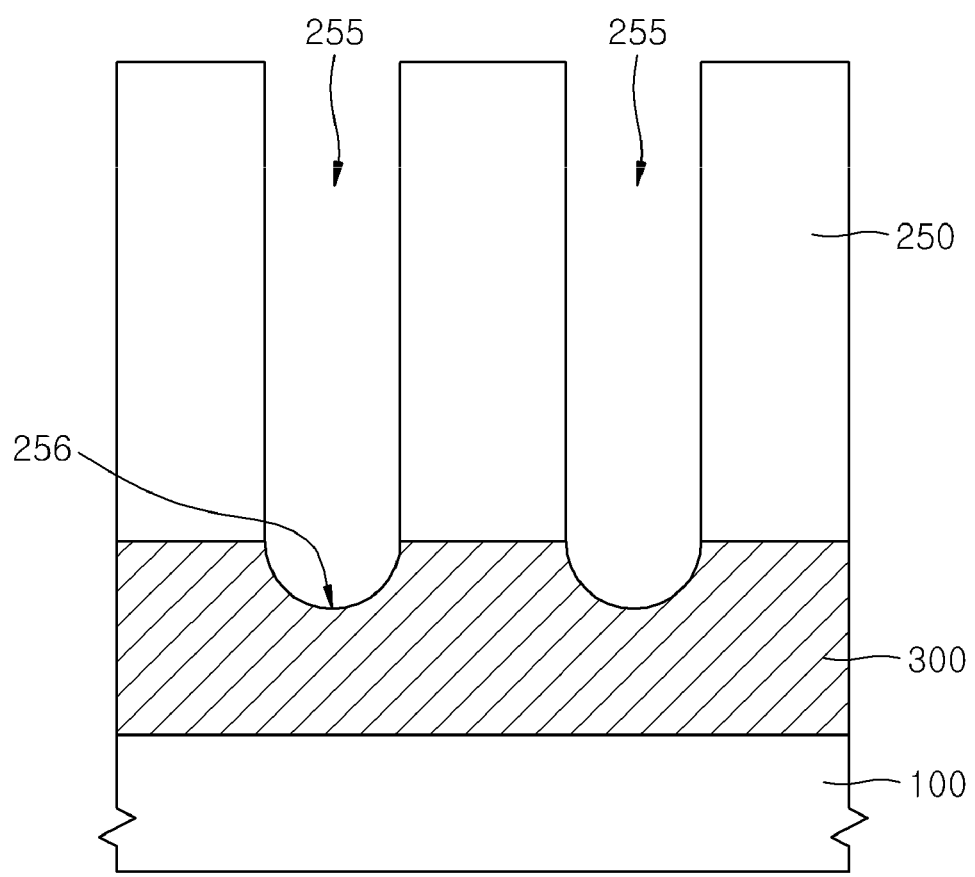

Referring to FIG. 4, the second dielectric layer 250 may be patterned to form second trenches 255 intersecting and exposing the first electrode lines 300. The second trenches 255 may extend in a direction that intersects the first electrode lines 300 at a right angle. The second trenches 255 may be formed by selectively removing portions of the second dielectric layer 250 using a photolithography process and an etch process. While the etch process for forming the second trenches 255 is performed, portions of the first electrode lines 300 may be etched such that the second trenches 255 have concave bottom surfaces 256. The second dielectric layer 250 having the second trenches 255 may be used as a template for a damascene process.

Figure 5:
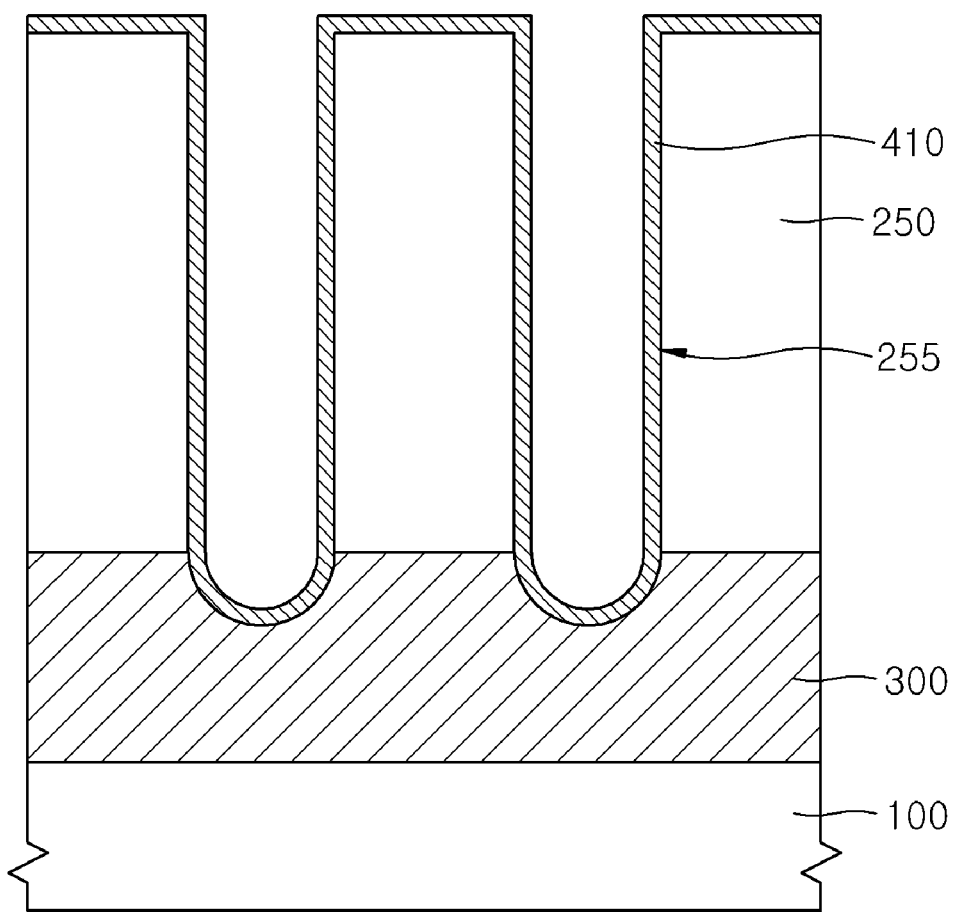

Referring to FIG. 5, a first intermediate layer 410 may be formed over exposed surfaces of the second dielectric layer 250 to conformally cover the bottom surfaces and sidewalls of the second trenches 255. The first intermediate layer 410 may provide data storage elements, for example, variable resistors of a ReRAM device having a MIMIM structure. Alternatively, the first intermediate layer 410 may provide switching elements, for example, selectors that allow cell currents to flow only in one direction in a ReRAM device having a MIMIM structure. In an embodiment in which the first intermediate layer 410 provides data storage elements, the first intermediate layer 410 may be formed of a material having at least two electrical or resistive states according to a voltage applied thereto. For example, the first intermediate layer 410 may include a resistance switching material.

The resistance switching material used as the first intermediate layer 410 may include a colossal magneto resistance (CMR) material or a PCMO material whose resistance value varies according to an electric field applied thereto. Alternatively, the resistance switching material may include a binary transition metal oxide material (e.g., a hafnium oxide material, a tantalum oxide material, a zirconium oxide material, a niobium oxide material, a titanium oxide material, a nickel oxide material or an aluminum oxide material) having a nonstoichiometric composition. The binary transition metal oxide material having a nonstoichiometric composition may contain a relatively high transition metal content compared to a stable binary transition metal oxide material having a stoichiometric composition.

In some embodiments, the resistance switching material may include a chalcogenide material having an amorphous state which is used in an ovonic switch. In other embodiments, the resistance switching material may be formed to include a ferroelectric material (e.g., a strontium titanium oxide (SrTiO$_3$) material or a strontium zirconium oxide (SrZrO$_3$) material) having a perovskite structure doped with chrome (Cr) or niobium (Nb). In still other embodiments, the resistance switching material may be formed to include a solid electrolyte material (e.g., a germanium selenide (GeSe) material) doped with silver (Ag) having a relatively high ion mobility. The solid electrolyte material doped with silver (Ag) may have a programmable metallization cell (PMC) structure. That is, the germanium selenide (GeSe) material doped with silver (Ag) may have two resistive states according to the presence or absence of conductive filaments generated by an electrochemical reaction. In still other embodiments, the resistance switching material may include a transition metal oxide material having a nonstoichiometric composition, for example, a titanium oxide (Ti$_4$O$_7$) material.

In embodiments in which the first intermediate layer 410 is a selector element, the first intermediate layer 410 may have various structures. For example, the first intermediate layer 410 may include a transition metal oxide layer for structural simplification. In some embodiments, the first intermediate layer 410 may include two stacked semiconductor layers having different conductivity types, such as a PN diode.

Figure 6:
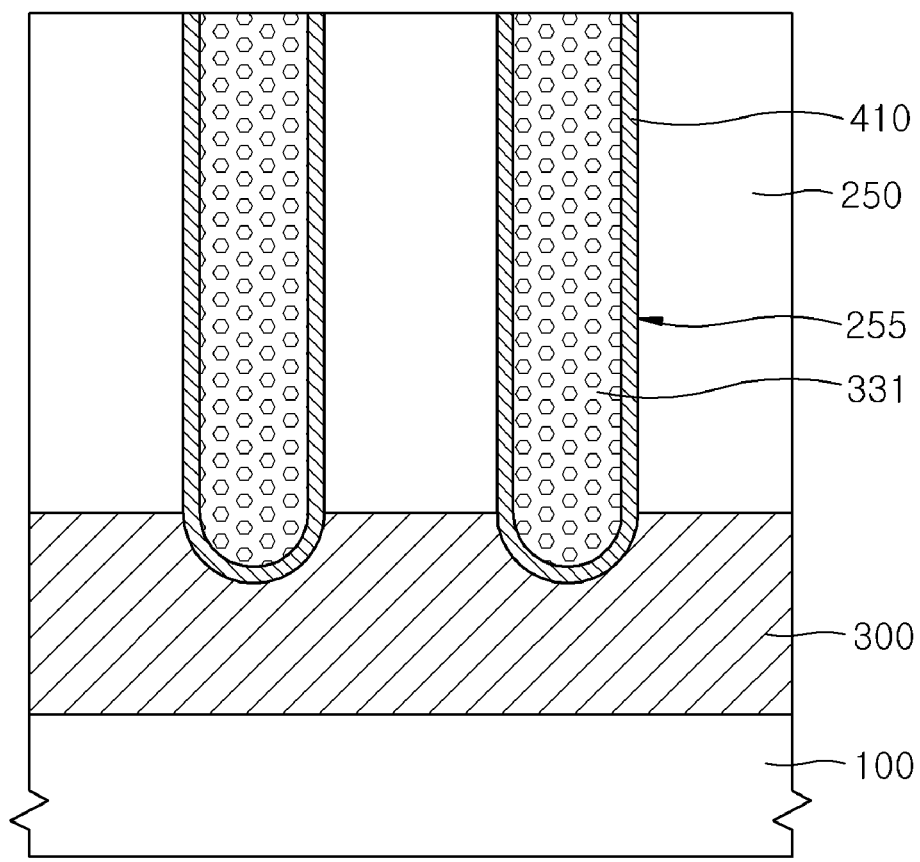

Referring to FIG. 6, a second conductive layer 331, that is, an inserted electrode layer may be formed on the first intermediate layer 410 to fill the second trenches 255. The second conductive layer 331 may provide intermediate electrodes disposed between lower electrodes (i.e., the first electrode lines 300) and upper electrodes (to be formed in a subsequent process). The second conductive layer 331 and the first intermediate layer 410 may be planarized using a chemical mechanical polishing (CMP) process to expose a top surface of the second dielectric layer 250. As a result, inserted electrode patterns 331 may be formed in the second trenches 255. The second conductive layer 331 may include a metal such as copper (Cu) or tungsten (W). Alternatively, the second conductive layer 331 may include silver (Ag), gold (Au), platinum (Pt), aluminum (Al), indium tin oxide (ITO), nickel (Ni), titanium (Ti) or titanium nitride (TiN).

Figure 7:
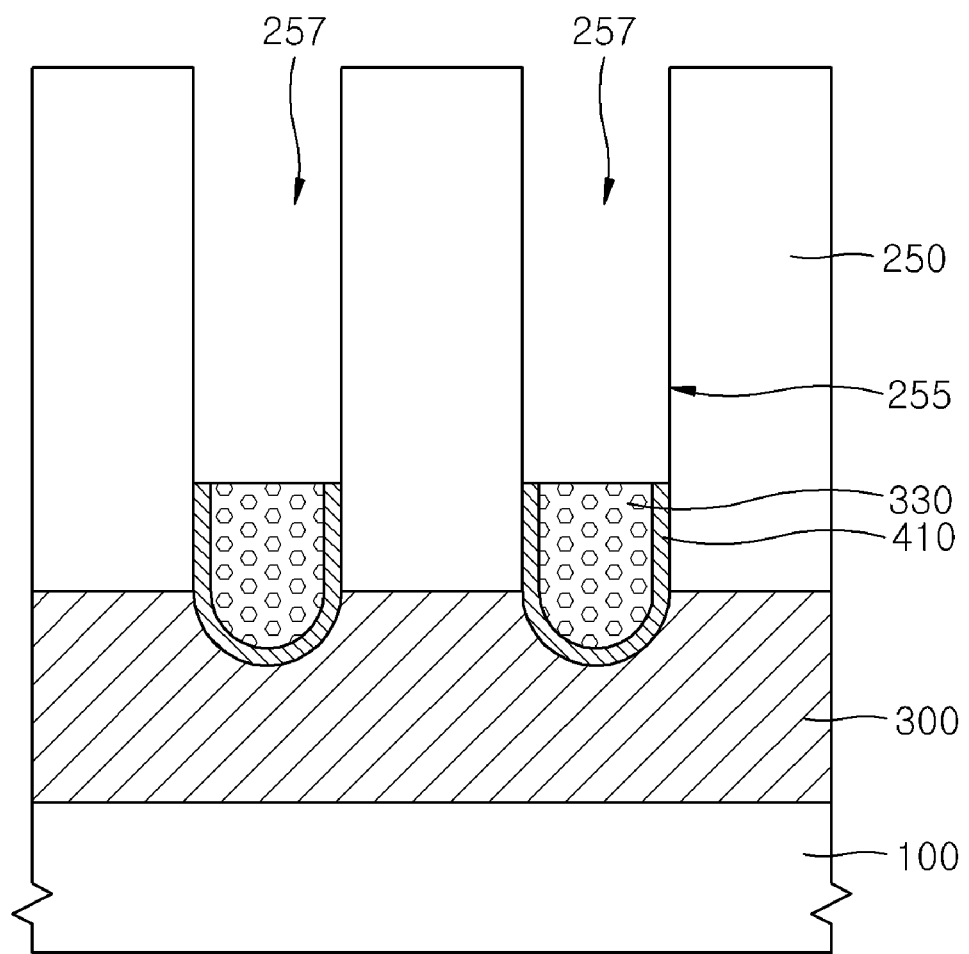

Referring to FIG. 7, the inserted electrode patterns 331 may be recessed to form inserted electrode lines 330 in the second trenches 255. The inserted electrode patterns 331 may be recessed using an etch process, for example, an anisotropic etch process such as a reactive ion etch (RIE) process to form inserted electrode lines 330 having top surfaces which are lower than a top surface of the second dielectric layer 250. The first intermediate layer 410 may also be recessed to form first intermediate patterns 410 exposing upper sidewall of the second trenches 255 in the same process of recessing the inserted electrode patterns 331 to form the inserted electrode lines 330. The second dielectric layer 250 may act as an etch mask for recessing (etching) the inserted electrode patterns 331.

As a result of the recession of the inserted electrode patterns 331, portions of the inserted electrode patterns 331 may remain in the second trenches 255 to form the inserted electrode lines 330, and third trenches 257 may be provided on the inserted electrode lines 330. The third trenches 257, which are upper portions of the second trenches 255, may expose top surfaces of the inserted electrode lines 330. The inserted electrode lines 330 may be disposed in the second trenches 255 and the first intermediate patterns 410 may cover bottom surfaces and sidewalls of the inserted electrode lines 330.

Figure 8:
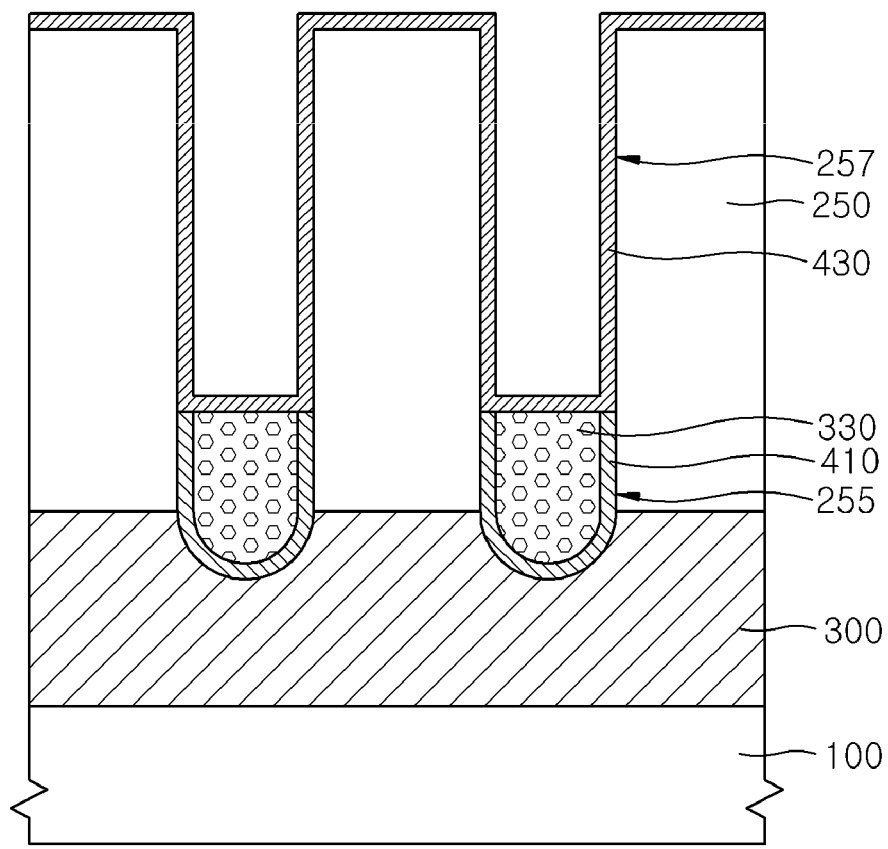

Referring to FIG. 8, a second intermediate layer 430 may be formed on the second dielectric layer 250 to conformally cover bottom surfaces and sidewalls of the third trenches 257. The second intermediate layer 430 may provide variable resistors or selectors of a ReRAM device having a MIMIM structure. In an embodiment in which the first intermediate layer 410 serves as variable resistors, the second intermediate layer 430 may be selectors. On the other hand, in an embodiment in which the first intermediate layer 410 serves as selectors, the second intermediate layer 430 may be variable resistors. The second intermediate layer 430 may cover the top surfaces of the inserted electrode lines 330 and may extend to cover the sidewalls of the third trenches 257 and the top surface of the second dielectric layer 250.

Figure 9:
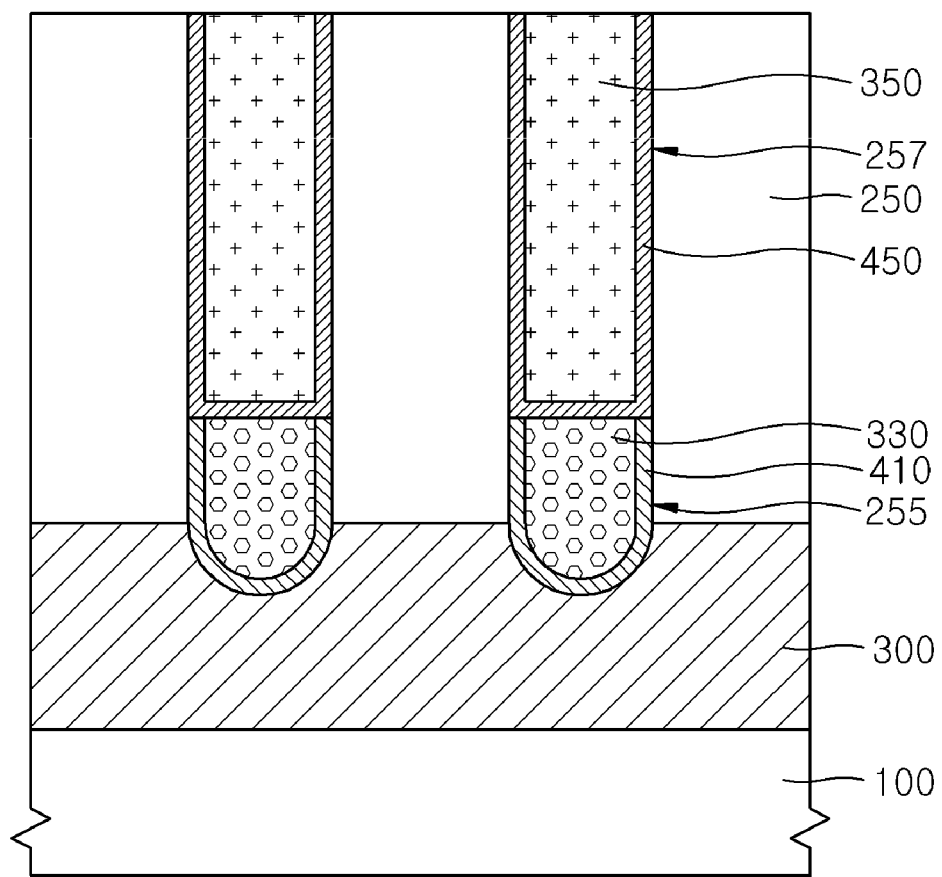

Referring to FIG. 9, a third conductive layer may be formed on the second intermediate layer 430 to fill the third trenches 257, and the third conductive layer and the second intermediate layer 430 may be planarized to form second electrode lines 350 in the third trenches 257. In some embodiments, the third conductive layer and the second intermediate layer 430 are planarized using a chemical mechanical polishing (CMP) process until a top surface of the second dielectric layer 250 is exposed. The third conductive layer may include a metal material such as copper (Cu) or tungsten (W). Alternatively, the third conductive layer may include silver (Ag), gold (Au), platinum (Pt), aluminum (Al), indium tin oxide (ITO), nickel (Ni), titanium (Ti) or titanium nitride (TiN). The planarization of the third conductive layer and the second intermediate layer 430 may form a plurality of second electrode lines 350 separated from each other and second intermediate patterns 450 covering bottom surfaces and sidewalls of the second electrode lines 350.

According to the embodiments described above, a ReRAM device having a MIMIM type cell structure may be formed. The ReRAM device may include inserted electrode lines 330 that are parallel and aligned with the second electrode lines 350, which may be used as upper electrodes or lower electrodes. The inserted electrode lines 330 and the second electrode lines 350 may be formed in the second trenches 255 using damascene processes. That is, the inserted electrode lines 330 and the second electrode lines 350 may be formed in trenches 255 without using an etch mask. Thus, the number of process steps for forming the ReRAM device can be reduced. The first intermediate patterns 410 disposed between the inserted electrode lines 330 and the first electrode lines 300, as well as the second intermediate patterns 450 disposed between the inserted electrode lines 330 and the second electrode lines 350, may also be formed in the second trenches 255. Thus, the first and second intermediate patterns 410 and 450 may also be formed to be parallel to and aligned with the second electrode lines 350 and the second trenches 255.

Embodiments have been disclosed above for illustrative purposes. Those skilled in the art will appreciate that various modifications, additions and substitutions are possible, without departing from the scope and spirit of the accompanying claims.

What is claimed is:
1. A nonvolatile memory device comprising:
a second electrode line intersecting a first electrode line, the first electrode line having an upper portion;
an inserted electrode line disposed between the first and second electrode lines and extending in parallel with the second electrode line, the inserted electrode line being coupled to the second electrode line and having a bottom portion;
a first intermediate pattern disposed between the inserted electrode line and the first electrode line and extending in parallel with the inserted electrode line, the first intermediate pattern being coupled to the inserted electrode line; and a second intermediate pattern disposed between the inserted electrode line and the second electrode line and extending in parallel with the inserted electrode line, the second intermediate pattern being coupled to the inserted electrode line, wherein the bottom portion of the inserted electrode line protrudes downwardly and is partially embedded in the upper portion of the first electrode line, and wherein one of the first and second intermediate patterns is a variable resistor and the other of the first and second intermediate patterns is a selector.

2. The nonvolatile memory device of claim 1, wherein the second electrode line, the first electrode line or the inserted electrode includes copper (Cu), tungsten (W), silver (Ag), gold (Au), platinum (Pt), aluminum (Al), indium tin oxide (ITO), nickel (Ni), titanium (Ti) or titanium nitride (TiN).

3. The nonvolatile memory device of claim 1, wherein the bottom portion of the inserted electrode has a convex shape coupled to a concave bottom surface of the upper portion of the first electrode line.

4. The nonvolatile memory device of claim 1, wherein the variable resistor includes a resistive switching material having at least two resistive states according to a voltage applied thereto.

5. The nonvolatile memory device of claim 4, wherein the resistive switching material includes a non-stoichiometric composition of a binary transition metal oxide material.

6. The nonvolatile memory device of claim 5, Wherein the binary transition metal oxide material is a hafnium oxide material, a tantalum oxide material, a zirconium oxide material, a niobium oxide material, a titanium oxide material, a nickel oxide material or an aluminum oxide material.

* * * * *